(12) United States Patent
Zhang

(10) Patent No.: US 9,673,266 B2
(45) Date of Patent: Jun. 6, 2017

(54) OLED PIXEL STRUCTURE AND METHOD FOR MANUFACTURING THE SAME, OLED DISPLAY PANEL AND OLED DISPLAY DEVICE

(71) Applicant: BOE TECHNOLOGY GROUP CO., LTD., Beijing (CN)

(72) Inventor: Peng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 1 day.

(21) Appl. No.: 14/437,118

(22) PCT Filed: Aug. 29, 2014

(86) PCT No.: PCT/CN2014/085502
§ 371 (c)(1),
(2) Date: Apr. 20, 2015

(87) PCT Pub. No.: WO2015/143838
PCT Pub. Date: Oct. 1, 2015

(65) Prior Publication Data
US 2016/0254333 A1    Sep. 1, 2016

(30) Foreign Application Priority Data

Mar. 28, 2014  (CN) .......................... 2014 1 0123863

(51) Int. Cl.
*H01L 27/32* (2006.01)
*H01L 51/56* (2006.01)
(Continued)

(52) U.S. Cl.
CPC ...... *H01L 27/3258* (2013.01); *H01L 27/3211* (2013.01); *H01L 27/3248* (2013.01);
(Continued)

(58) Field of Classification Search
CPC ............. H01L 27/3258; H01L 27/3211; H01L 27/3248; H01L 27/3244; H01L 27/3281;
(Continued)

(56) References Cited

U.S. PATENT DOCUMENTS

2008/0211385 A1     9/2008 Kim et al.
2008/0303755 A1*   12/2008 Oh ...................... H01L 27/3288
                                                              345/76
(Continued)

FOREIGN PATENT DOCUMENTS

CN          1575057 A     2/2005
CN          1849847 A    10/2006
(Continued)

OTHER PUBLICATIONS

Chisca et al. Dielectric and Conductive Properties of Polyimide Films. "Petru Poli" Institute of Macromolecular Chemistry, Aleea Gr. Chica Voda 41A Iasi 700487, Romania, pp. 253-256.*
(Continued)

*Primary Examiner* — Galina Yushina
(74) *Attorney, Agent, or Firm* — Kinney & Lange, P.A.

(57) ABSTRACT

Embodiments of the present disclosure relate to an OLED pixel structure and a method for manufacturing the same, an OLED display panel having the OLED pixel structure, and an OLED display device having the OLED display panel. An OLED pixel structure comprises a plurality of sub-pixel units. Each of said sub-pixel units comprises: a first electrode, an organic material functional layer and a second electrode arranged in that order on said substrate plate; and an intermediate layer arranged between said substrate plate and said first electrode; wherein, a surface of said intermediate layer away from said substrate plate has a recess of arc shape; and said first electrode is located within said recess such that said first electrode, said organic material functional (Continued)

layer and said second electrode each has an arc shape corresponding to the arc shape of said recess. With these technical solutions according to the present disclosure, these problems of the narrow angle of view, and of different strengths and colors of the light as being viewed from different viewing angles, can be alleviated.

10 Claims, 5 Drawing Sheets

(51) Int. Cl.
*H01L 51/52* (2006.01)
*H01L 51/50* (2006.01)

(52) U.S. Cl.
CPC ...... *H01L 51/5012* (2013.01); *H01L 51/5056* (2013.01); *H01L 51/5072* (2013.01); *H01L 51/5209* (2013.01); *H01L 51/5218* (2013.01); *H01L 51/5234* (2013.01); *H01L 51/5253* (2013.01); *H01L 51/56* (2013.01); *H01L 51/5271* (2013.01); *H01L 2227/323* (2013.01); *H01L 2251/308* (2013.01); *H01L 2251/5315* (2013.01); *H01L 2251/558* (2013.01)

(58) Field of Classification Search
CPC . H01L 27/32; H01L 51/5072; H01L 51/5218; H01L 51/5234; H01L 51/5253; H01L 51/56; H01L 2227/323; H01L 2251/308; H01L 2251/5315; H01L 2251/568; H01L 2225/50; H01L 2227/32; H01L 51/5209; H01L 51/5271; H01L 51/5012; H01L 51/5026

See application file for complete search history.

(56) References Cited

U.S. PATENT DOCUMENTS

| | | | |
|---|---|---|---|
| 2009/0015149 A1* | 1/2009 | Lee | H01L 27/3244 313/504 |
| 2010/0181554 A1* | 7/2010 | Yoshida | H01L 51/5209 257/40 |
| 2012/0049175 A1* | 3/2012 | Ono | H01L 27/3246 257/40 |
| 2014/0312312 A1* | 10/2014 | Takii | H01L 27/3262 257/40 |
| 2014/0312319 A1* | 10/2014 | Kim | H01L 27/3258 257/40 |
| 2014/0361253 A1* | 12/2014 | Choi | H01L 27/32 257/40 |

FOREIGN PATENT DOCUMENTS

| | | |
|---|---|---|
| CN | 1947464 A | 4/2007 |
| CN | 101455122 A | 6/2009 |
| CN | 101681997 A | 3/2010 |
| CN | 103943787 A | 7/2014 |
| CN | 203760520 U | 8/2014 |
| TW | 451599 B | 8/2001 |

OTHER PUBLICATIONS

Second Chinese Office Action (including English translation) dated Mar. 17, 2016, for corresponding Chinese Application No. 201410123863.8.
First Chinese Office Action and English translation dated Oct. 29, 2015, for corresponding Chinese Application No. 201410123863.8.
International Search Report and Written Opinion in Chinese dated Dec. 1, 2014 for PCT/CN2014/085502.

\* cited by examiner

OLED PIXEL STRUCTURE AND METHOD FOR MANUFACTURING THE SAME, OLED DISPLAY PANEL AND OLED DISPLAY DEVICE

BACKGROUND OF THE INVENTION

1. Field of the Invention

The disclosure relates to the field of display technology, and particularly to an OLED pixel structure and a method for manufacturing the same, an OLED display panel and an OLED display device having the OLED display panel.

2. Description of the Related Art

Organic Light Emitting Diode (OLED for short) is an organic thin film electroluminescence device which has advantages of simple manufacture process, low cost, flexibility of the structure, wide angle of view, etc. As a result, the displaying technology employing an Organic Light Emitting Diode has been an important displaying technology.

Whether a top emission OLED pixel structure or a bottom emission OLED pixel structure, however, it will encounter some degree of microcavity effect. Microcavity effect mainly refers to that photon densities at different energy states are reallocated such that light with certain wavelength will be emitted at certain angle once it conforms to a resonant cavity mode. Especially, as to the top emission OLED pixel structure, an electrode that is near the substrate has a higher reflectivity, while an electrode that is away from the substrate usually employs a translucent metal thin film which will increase reflection of light to generate interference among multiple photon beams between the two electrodes so as to achieve a greater microcavity effect.

For example, as shown in FIG. 1, a top emission OLED pixel structure 01 is taken as an example, and it comprises a reflective anode 11, an organic material functional layer 30, a translucent metal cathode 12 arranged in that order on a substrate 10. Both an interface between the translucent metal cathode 12 and the organic material functional layer 30 and an interface between the reflective anode 11 and the organic material functional layer 30 are planar. And, the reflective anode 11, the organic material functional layer 30 and the translucent metal cathode 12 constitute a microcavity.

With the abovementioned structure, directions of emission of the interfered photon beams generated due to the microcavity effect are almost vertical ones, which results in these problems of the narrow angle of view, and different strengths and colors of the light as being viewed from different viewing angles.

SUMMARY

In accordance with an aspect of the embodiments of the present disclosure, there is provided an OLED pixel structure comprising a substrate plate and a plurality of sub-pixel units, wherein each of the sub-pixel units comprises: a first electrode, an organic material functional layer and a second electrode arranged in that order on the substrate plate; and a intermediate layer arranged between the substrate plate and the first electrode; wherein, a surface of the intermediate layer away from the substrate plate has a recess of arc shape; and the first electrode is located within the recess such that the first electrode, the organic material functional layer and the second electrode each has an arc shape corresponding to the arc shape of the recess.

In accordance with another aspect of the embodiments of the present disclosure, there is provided a method for manufacturing an OLED pixel structure comprising a plurality of sub-pixel units, the method comprises steps of:

forming a intermediate layer on a substrate plate, and, forming, on a region corresponding to a first electrode of each of the plurality of sub-pixel units, a recess of arc shape on a surface of the intermediate layer away from the substrate plate; and forming the first electrode, an organic material functional layer and a second electrode in that order on each recess such that the first electrode, the organic material functional layer and the second electrode each has an arc shape corresponding to the arc shape of the recess.

In accordance with yet another aspect of the embodiments of the present disclosure, there is provided an OLED display panel comprising the above mentioned OLED pixel structure.

In accordance with still another aspect of the embodiments of the present disclosure, there is provided an OLED display device comprising the above mentioned OLED display panel.

BRIEF DESCRIPTION OF THE DRAWINGS

In order to describe embodiments of the present invention or technical solutions in the prior art more clearly, accompanying drawings required for describing the embodiments or the prior art will be simply explained as below. Apparently, the accompanying drawings for the following description are only some embodiments of the present invention. Those skilled in the art also could derive other accompanying drawings from these accompanying drawings without making a creative work.

Figure 1:
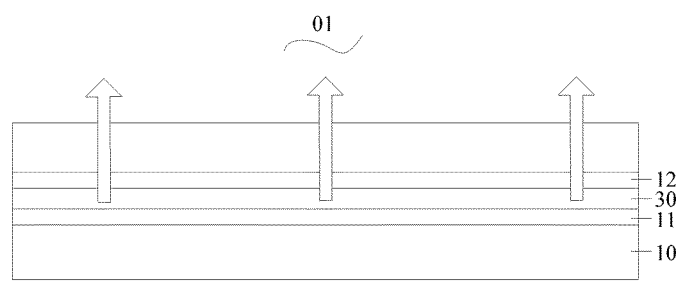
FIG. 1 is a schematic structural view showing an OLED pixel structure in the prior art.

Reference Symbols In The Drawings.

01—OLED pixel structure, 10—substrate plate, 11—reflective anode, 12—translucent metal cathode, 20—first electrode, 201—opaque metal layer, 202—layer of tin indium oxide, 30—organic material functional layer, 40—second electrode, 50—intermediate layer, 50a—intermediate layer thin film, 50b—recess of arc shape, 60—thin-film transistor, 601—gate, 602—gate insulating layer, 603—semiconductor active layer, 604—source, 605—drain, 70—buffer layer, 80—encapsulated layer, 90—mask plate, 901—opening on the mask plate.

DETAILED DESCRIPTION OF THE EMBODIMENTS

A thorough and complete description of technical solutions of embodiments of the disclosure will be made as below with reference to these embodiments of the present disclosure taken in conjunction with the accompanying drawings. The embodiments set forth herein, however, merely are some, but not all, of the embodiments of the present disclosure. On the basis of these embodiments set forth herein of the present disclosure, all other embodiments which are made without involving any inventive steps by those skilled in the art should be included within the scope of the present disclosure.

An OLED pixel structure 01 is provided in an embodiment of the present disclosure. The OLED pixel structure 01 comprises a substrate plate 10 and a plurality of sub-pixel units. Each of the sub-pixel units comprises: a first electrode 20, an organic material functional layer 30 and a second electrode 40 provided in that order on the substrate plate 10; and a intermediate layer 50 arranged between the substrate plate 10 and the first electrode 20; wherein, a surface of the intermediate layer 50 away from the substrate plate 10 has a recess 50b (see FIG. 9) of arc shape; and the first electrode 20 is located within the recess such that the first electrode 20, the organic material functional layer 30 and the second electrode 40 each has an arc shape corresponding to the arc shape of the recess.

The first electrode 20 may be an opaque metal layer, while the second electrode 40 may be a translucent metal electrode.

It should be explained that, firstly, there is no limitation on material for forming the intermediate layer 50, as long as it can be formed with a recess of arc shape on its surface away from the substrate plate 10.

The intermediate layer 50 is electrically insulated from the first electrode. In one embodiment, the material for forming the intermediate layer 50 is an electrically insulating material, and the intermediate layer 50 is in direct contact with the first electrode 20. In another embodiment, the material for forming the intermediate layer 50 is an electrically conductive material, and an insulation layer 51 is provided between the intermediate layer 50 and the first electrode 20, as shown in FIG. 2a. Specific arrangement may be made according to practical situation, which will not be described repeatedly herein.

Secondly, as the intermediate layer 50 is located below the first electrode 20, that is, the intermediate layer 50 at the lower place is prepared ahead and then the first electrode 20 at the upper place is formed, accordingly, if the upper surface of the intermediate layer 50 corresponding to the first electrode 20 has a recessed arc shape, the first electrode 20 formed on the intermediate layer accordingly has a recessed arc shape. For same reason, the organic material functional layer 30 and the second electrode 40 located over the first electrode 20 accordingly have recessed arc shapes.

Thirdly, the first electrode 20 may be cathode or anode, while the second electrode 40 may be anode or cathode. That is, the second electrode 40 is an anode if the first electrode 20 is a cathode, or, the second electrode 40 is a cathode if the first electrode 20 is an anode.

As to the organic material functional layer 30, it may comprise at least an electron transport layer, an emitting layer and a hole transport layer. Based on this, in order to enhance efficiencies of electron and hole injections to the emitting layer, the organic material functional layer 30 may further comprise an electron injection layer arranged between a cathode and the electron transport layer and a hole injection layer arranged between the hole transport layer and an anode.

Based on this, when an operating voltage is applied to the anode and the cathode, both the through-holes from the anode and the electrons from the cathode are injected into the light emitting layer. The holes and the electrons meet each other within the emitting layer to recombine an electron-hole pair and release energy. This energy is released as light, and then, lights of different colors is displayed as the light passed, through different luminescent molecules. And, they are emitted evenly from both sides of the organic material functional layer 30.

In three sub-pixel units of one pixel unit, the light emitting layers may comprise red light emitting molecules, green light emitting molecules and blue light emitting molecules, respectively. Of course, the abovementioned light emitting layer may also comprise only white light emitting molecules. There is no limitation on this herein.

Fourthly, the OLED pixel structure 01 may be a passive matrix type pixel structure, or an active matrix type pixel structure. There is no limitation on this herein.

Fifthly, in the embodiments of the present disclosure, the adjacent first electrodes 20 may be separated by a pixel separator layer, which will not be described repeatedly herein.

Sixthly, these drawings accompanied with these embodiments of the present disclosure merely schematically show these patterned layers which are related to the conceptive point, while, these patterned layers which are not related to the conceptive point are shown in part or not shown.

Compared with the prior art, in the embodiments of the present disclosure, the surface of the intermediate layer 50 corresponding to the first electrode 20 but being away from the substrate plate 10 is configured to have a recessed arc shape, such that the surfaces of the first electrode 20 and the second electrode 40 each has a recessed arc shape. As a result, lights emitted from the light emitting layer of the organic material functional layer 30 may form interference among multiple photon beams from multiple directions between the first electrode 20 and the second electrode 40 such that an emission ratio of lights at different directions is increased, and accordingly, the angle of view of the OLED display device is increased. On the basis of this, strengths and colors of lights as being viewed at different viewing angles are improved.

Figure 4:
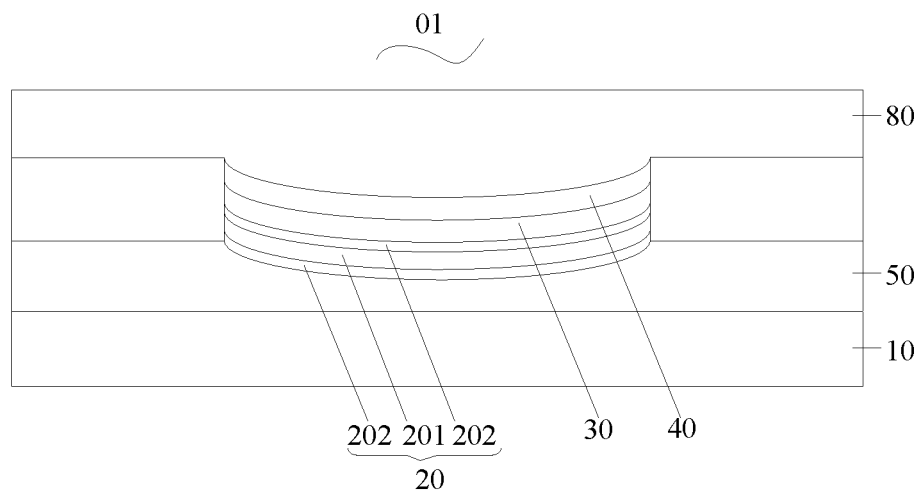
FIG. 4 is a second schematic structural view showing an OLED pixel structure according to an embodiment of the present disclosure.

In an embodiment of the present disclosure, as shown in FIG. 4, the first electrode 20 may comprise an opaque metal layer 201 and layers 202 of tin indium oxide (ITO) arranged at both sides of the opaque metal layer. As a result, energy level of the first electrode 20 may match that of the organic material functional layer 30, which facilitates injection of carriers of the first electrode 20 into the light emitting layer of the organic material functional layer 30.

The second electrode 40 may be a silver conductive layer having a relatively small thickness.

In an alternative embodiment of the present disclosure, the intermediate layer 50 may have a thickness of 2 μm~5 μm. Accordingly, the OLED display device is not too thick to meet the thinning tendency in market, or too thin to prepare the intermediate layer 50 having a surface in recessed arc shape.

In an embodiment of the present disclosure, material for forming the intermediate layer 50 may be polyimide (PI). This is because, the PI is not compact, and thus it is easy to etch a portion of the intermediate layer 50 of PI material that is needed to be recessed, so as to obtain a desired etching effect when the intermediate layer 50 having the surface in recessed arc shape is prepared by a dry etching.

Figure 5:
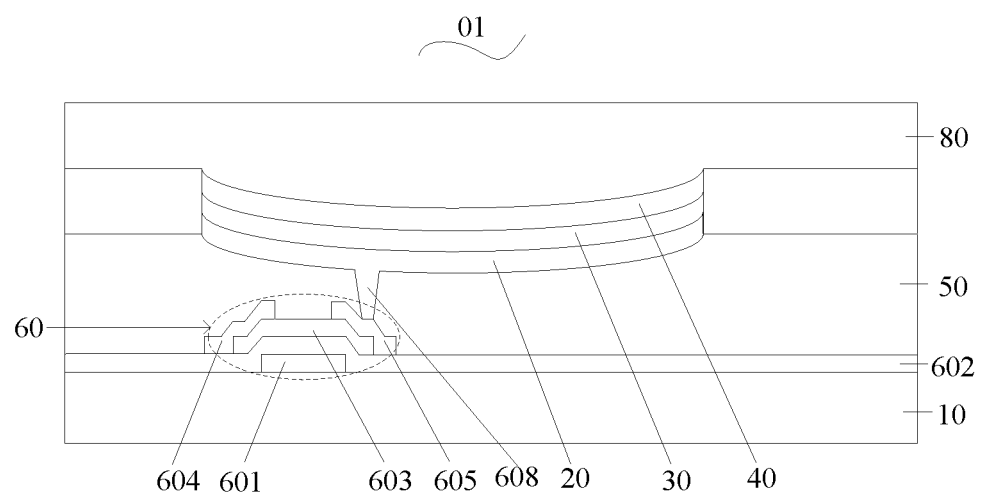
FIG. 5 is a schematic structural view showing an OLED pixel structure, including a thin-film transistor, according to an embodiment of the present disclosure.

Based on the above, in consideration of disadvantages of application of a passive matrix on a large-sized display device, the OLED pixel structure 01 according to embodiments of the present disclosure is a passive matrix type OLED pixel structure. That is, as shown in FIG. 5, each sub-pixel unit in the OLED pixel structure 01 further comprises a thin-film transistor 60 arranged between the substrate plate 10 and the intermediate layer 50.

The thin-film transistor 60 comprises a gate 601, a gate insulating layer 602, a semiconductor active layer 603, a source 604 and a drain 605. The thin-film transistor 60 may be either a top gate type or a bottom gate type.

Of course, the OLED pixel structure 01 further comprises grid lines and grid line leads (not shown in Figures) electrically connected to the gate 601, data line and data line leads (not shown in Figs) electrically connected to the source 604, etc.

Moreover, if the drain 605 is electrically connected with the second electrode 40, the second electrode 40 should be passed through the organic material functional layer 30 and the first electrode 20 to electrically connect to the drain 605 through a via hole 608. In this way, on one hand, a short circuit may occur between the second electrode 40 and the first electrode 20, and on the other hand, a relatively complicated preparation process is led due to the specificity of material of the organic material functional layer 30. Considering the above, in the embodiments of the present disclosure, the drain 605 is electrically connected with the first electrode 20 and the first electrode 20 is electrically connected with the drain 605 of the thin-film transistor through the through hole 608 in the intermediate layer 50.

Figure 6:
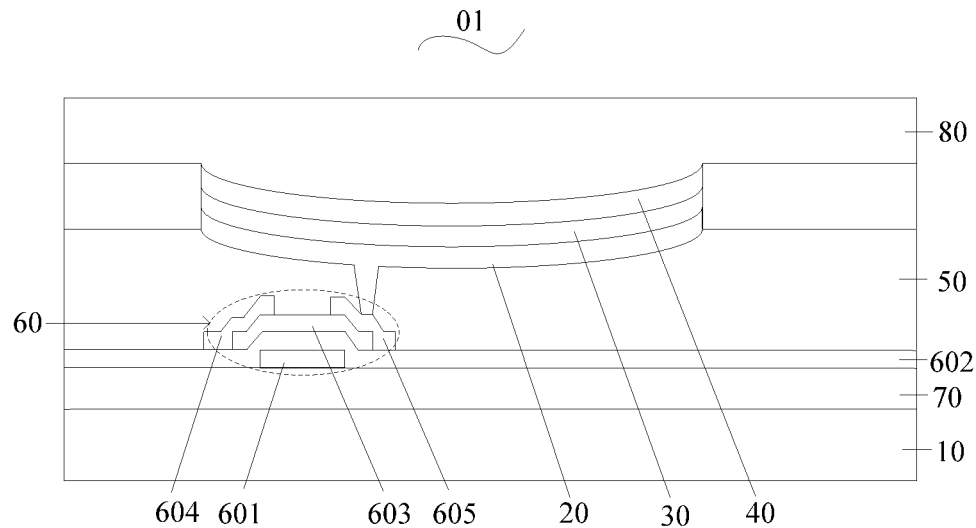
FIG. 6 is a schematic structural view showing an OLED pixel structure, including a buffer layer, according to an embodiment of the present disclosure.

In an embodiment of the present disclosure, as shown in FIG. 6, the OLED pixel structure 01 further comprises a buffer layer 70 arranged between the substrate plate 10 and the thin-film transistor 60, the buffer layer 70 being contacted with the substrate plate 10.

The buffer layer 70 may be in a configuration of monolayer or multiplayer, and, may be made from SiN (silicon nitride), SiOx (silicon oxides), etc.

The use of the buffer layer 70 not only facilitates to improve surface smoothness and adhesive force of the substrate plate 10, but also helps to improve resistance to water and oxygen permeability.

It should be explained that, in the embodiments of the present disclosure, due to specificity of the material for forming the organic material functional layer 30, the OLED pixel structure 01 may further comprise an encapsulated layer 80 for encapsulation of organic materials. The encapsulated layer 80 may be a thin film encapsulation or a substrate plate encapsulation, and there is no limitation on this herein.

Figure 7:
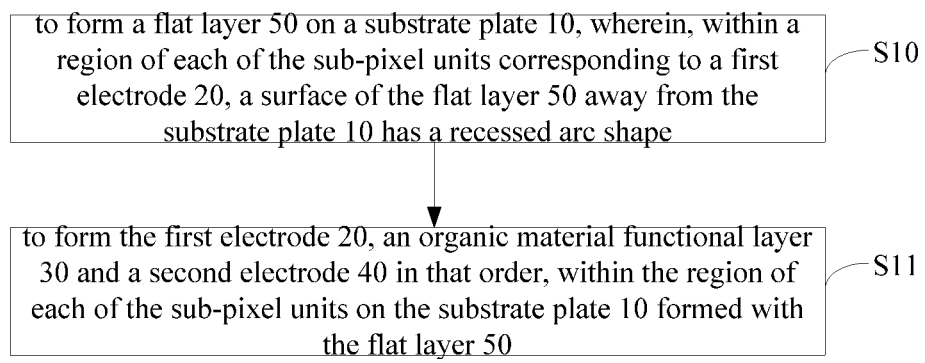
FIG. 7 is a schematic flow view showing a method of manufacturing an OLED pixel structure according to an embodiment of the present disclosure.

A method for manufacturing an OLED pixel structure comprising a plurality of sub-pixel units is also provided in the embodiments of the present disclosure. As shown in FIG. 7, the method comprises the following steps.

Figure 2:
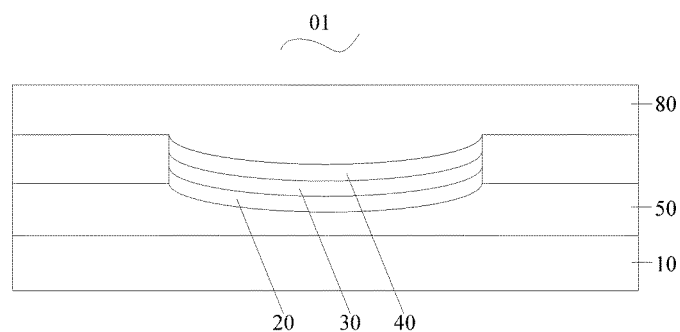
FIG. 2 is a first schematic structural view showing an OLED pixel structure according to an embodiment of the present disclosure.
Figure 2A:
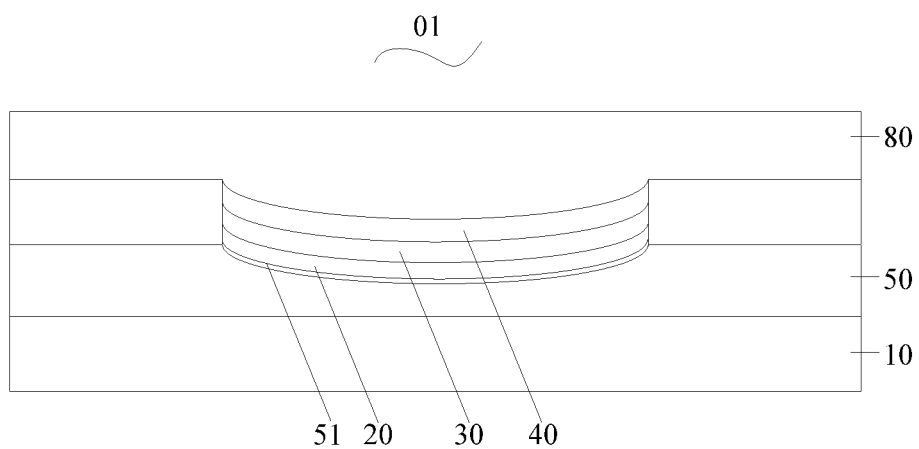
FIG. 2a is a first schematic structural view showing an OLED pixel structure according to another embodiment of the present disclosure.
Figure 3:
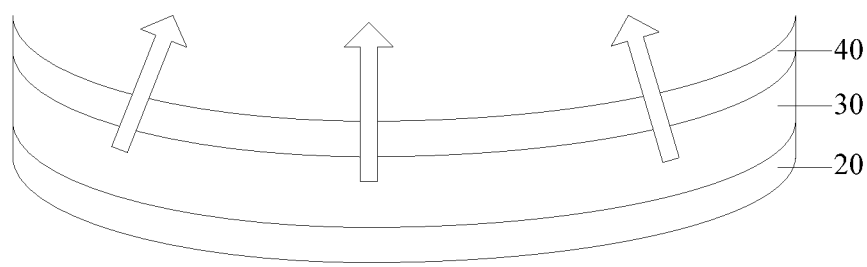
FIG. 3 is a schematic diagram showing interference, among multiple photon beams from multiple directions, generated by an OLED pixel structure according to an embodiment of the present disclosure.

S10, referring to FIG. 2, to form a intermediate layer 50 on a substrate plate 10, wherein, within a region of each of the sub-pixel units corresponding to a first electrode 20, a surface of the intermediate layer 50 away from the substrate plate 10 has a recessed arc shape.

S11, referring to FIG. 2, to form the first electrode 20, an organic material functional layer 30 and a second electrode 40 in that order, within the region of each of the sub-pixel units on the substrate plate 10 formed with the intermediate layer 50, such that the first electrode, the organic material functional layer and the second electrode each has an arc shape corresponding to the arc shape of the recess.

The first electrode 20 may be an opaque metal layer, while the second electrode 40 may be a translucent metal electrode.

It should be explained that, firstly, there is no limitation on the formation method of the intermediate layer 50 having a surface of the recessed arc shape.

Secondly, since the intermediate layer 50 at the lower place is prepared ahead and then the first electrode 20 is formed on the intermediate layer, when the upper surface of the intermediate layer 50 corresponding to the first electrode 20 has a recessed arc shape, the first electrode 20 formed on the intermediate layer accordingly has a recessed arc shape. For same reason, the organic material functional layer 30 and the second electrode 40 located over the first electrode 20 accordingly have recessed arc shapes.

Compared with the prior art, in the embodiments of the present disclosure, the surface of the intermediate layer 50 corresponding to the first electrode 20 but being away from the substrate plate 10 is configured to have a recessed arc shape, such that the surfaces of the first electrode 20 and the second electrode 40 each has a recessed arc shape. As a result, lights emitted from the emitting layer of the organic material functional layer 30 may form interference among multiple photon beams from multiple directions between the first electrode 20 and the second electrode 40 such that an emission ratio of lights at different directions is increased, and accordingly, the angle of view of the OLED display device is increased. On the basis of this, strengths and colors of lights as being viewed at different viewing angles are improved.

In an embodiment of the present disclosure, the above-mentioned step S10 may further comprises the followings.

Figure 8:
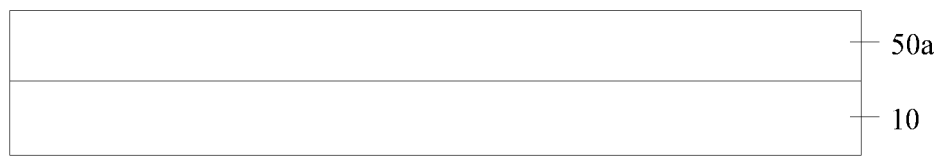
FIGS. 8-10 are schematic flows view showing these procedures of forming an arc-shaped intermediate layer having a recess on a surface thereof, according to an embodiment of the present disclosure.

S101, referring to FIG. 8, to form a intermediate layer thin film 50a on the substrate plate 10.

Because the structure of PI is not compact, once the intermediate layer 50 having the surface of recessed arc shape is prepared by a dry etching, it is easy to etch a portion of the intermediate layer 50 of PI material that is needed to be recessed, so as to obtain a desired etching effect. Material for forming the intermediate layer thin film 50a may be PI material.

Figure 9:
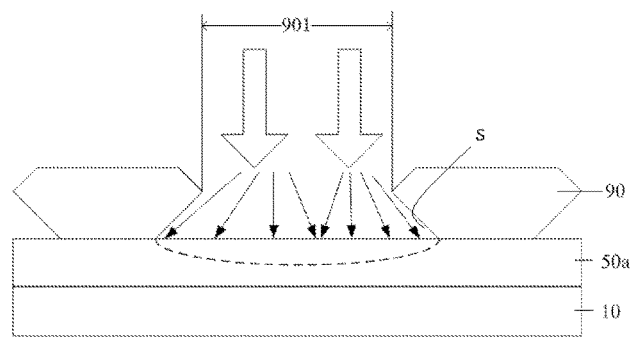
Figure 10:
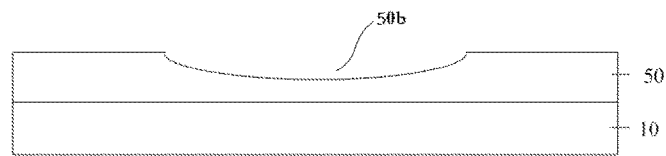

S102, referring to FIG. 9, by a shielding effect of a patterned mask plate 90, a drying etching is performed on the intermediate layer thin film 50a which is not shielded completely by the mask plate 90, such that the intermediate layer 50 having a surface of the recessed arc shape, as shown in FIG. 10, is formed.

The opening in the mask plate 901 corresponds to a predetermined region of the sub-pixel unit, and, an area of the opening 901 at a side near the intermediate layer thin film 50a is greater than an area of the opening 901 at the other side away from the intermediate layer thin film 50a (where the plasma comes into).

It should be explained that, the drying etching is a technology of etching a thin film using a plasma. Based on this, in the embodiments of the present disclosure, the mask plate 90 having a shape shown in FIG. 9 is used as the shield, that is, a shadow effect of the mask plate 90 is used. Because the plasma, within a region (in which a space S is presented between the mask plate 90 and the intermediate layer thin film 50a) vertically blocked by the mask plate 90, has a relatively smaller concentration, the closer to the margin of the mask plate 90, the poorer is the etching effect, i.e., a relatively lesser depth is obtained. Meanwhile, because the plasma, within a region rightly against the opening on the mask plate 901, has a relatively greater concentration due to direct access of the plasma, the etching effect is greater there, accordingly, a relatively greater depth is obtained.

Secondly, the predetermined region is a region having a depth greater than certain recessed depth, within the region of each of the sub-pixel units corresponding to the first electrode 20.

Thirdly, the dry etching performed on the intermediate layer thin film 50a which is not shielded completely by the mask plate 90 means that the plasma that comes into at the opening 901 may etch the intermediate layer thin film 50a as long as a space S is presented between the mask plate 90 and the intermediate layer thin film 50a.

Referring to FIG. 4, the first electrode 20 may comprise an opaque metal layer 201 and layers 202 of tin indium oxide (ITO) arranged at both sides of the opaque metal layer. The second electrode 40 may be a silver conductive layer having a relatively small thickness.

In the abovementioned method, the intermediate layer 50 may have a thickness of 2 μm~5 μm. Accordingly, the OLED display device is not be too thick to meet the thinning tendency in market, or too thin to prepare the intermediate layer 50 having a surface of recessed arc shape.

In the abovementioned method, material for forming the intermediate layer 50 may be polyimide (PI). Based on the above, in consideration of disadvantages of application of a passive matrix on a large-sized display device, the OLED pixel structure 01 according to embodiments of the present disclosure is a passive matrix type OLED pixel structure. That is, as shown in FIG. 5, each sub-pixel unit in the OLED pixel structure 01 further comprises a thin-film transistor 60 arranged between the substrate plate 10 and the intermediate layer 50.

The thin-film transistor 60 comprises a gate 601, a gate insulating layer 602, a semiconductor active layer 603, a source 604 and a drain 605. The thin-film transistor 60 may be either a top gate type or a bottom gate type.

Moreover, the first electrode 20 is electrically connected with the drain 605 of the thin-film transistor through the through hole 608 in the intermediate layer 50.

Referring to FIG. 6, the method may further comprise a step of forming a buffer layer 70 between the substrate plate 10 and the thin-film transistor 60, wherein the buffer layer 70 is in contact with the substrate plate 10. The use of the buffer layer 70 not only facilitates to improve surface smoothness and adhesive force of the substrate plate 10, but also helps to improve resistance to water and oxygen permeability.

In accordance with yet another aspect of the embodiments of the present disclosure, there is provided an OLED display panel comprising the abovementioned OLED pixel structure.

In accordance with still another aspect of the embodiments of the present disclosure, there is provided an OLED display device comprising the abovementioned OLED display panel.

The above description is merely used to illustrate specific embodiments of the present disclosure, but not to limit the present disclosure. It will be understood by those skilled in the art that various changes and modifications made within principles and spirit of the present disclosure should be included within the scope of the present disclosure. The scope of the present disclosure is defined in the appended claims and their equivalents.

What is claimed is:

1. An OLED pixel structure comprising a substrate plate and a plurality of sub-pixel units, each of said plurality of sub-pixel units comprising:
   a first electrode, an organic material functional layer and a second electrode arranged in that order on said substrate plate; and
   an intermediate layer arranged between said substrate plate and said first electrode;
   wherein,
   a surface of said intermediate layer away from said substrate plate has a recess of arc shape;
   said first electrode is located within said recess such that said first electrode, said organic material functional layer and said second electrode each has an arc shape corresponding to the arc shape of said recess; and
   a thin-film transistor is arranged between said substrate plate and said intermediate layer, and, said first electrode is electrically connected with a drain of said thin-film transistor, via a through hole formed, within a projection of said recess onto said substrate plate, in said intermediate layer.

2. The OLED pixel structure of claim 1, wherein, said intermediate layer excepting a portion thereof where the recess is formed has a thickness of 2 μm~5 μm.

3. The OLED pixel structure of claim 1, wherein, said intermediate layer is electrically insulated from said first electrode.

4. The OLED pixel structure of claim 1, wherein, a material for forming said intermediate layer comprises polyimide.

5. The OLED pixel structure of claim 1, wherein, said first electrode comprises an opaque metal layer and layers of tin indium oxide arranged respectively at top and bottom sides of said opaque metal layer.

6. The OLED pixel structure of claim 5, wherein, said second electrode comprises a silver conductive layer.

7. The OLED pixel structure of claim 1, wherein, said OLED pixel structure further comprises a buffer layer arranged between said substrate plate and said thin-film transistor and contacted with said substrate plate.

8. A method for manufacturing an OLED pixel structure comprising a plurality of sub-pixel units, the method comprising steps of:
   forming an intermediate layer on a substrate plate, and, forming, at a region corresponding to a first electrode of each of the sub-pixel units, a recess of arc shape on a surface of said intermediate layer away from said substrate plate;
   forming said first electrode, an organic material functional layer and a second electrode in that order on each recess such that said first electrode, said organic material functional layer and said second electrode each has an arc shape corresponding to the arc shape of said recess;
   wherein:
   each of said plurality of sub-pixel units further comprises a thin-film transistor arranged between said substrate plate and said intermediate layer;
   the step of forming the intermediate layer on the substrate plate further comprises forming a through hole at said recess of said intermediate layer; and the step of forming the first electrode on each recess further comprises electrically connecting said first electrode with a drain of said thin-film transistor via said through hole.

9. The method of claim 8, wherein, the step of forming the intermediate layer on the substrate plate further comprises:
   forming an intermediate layer thin film on said substrate plate; and
   placing a mask plate having an opening above said surface of said intermediate layer thin film, and dry etching said surface of said intermediate layer thin film by using a plasma coming into said opening to form said recess, wherein an area of said opening at a side near said intermediate layer thin film is greater than an area of said opening at a side where the plasma comes into.

10. The method of claim 8, wherein,
   the step of forming the first electrode on each recess further comprises:
      arranging a layer of tin indium oxide on said recess;
      arranging an opaque metal layer over said layer of tin indium oxide; and
      arranging another layer of tin indium oxide over said opaque metal layer;
      wherein, the translucent metal layer and the two layers of tin indium oxide each has an arc shape corresponding to the arc shape of said recess.

* * * * *